United States Patent [19]

Watkinson

[11] 4,399,560
[45] Aug. 16, 1983

[54] DOUBLE PHASE LOCK LOOP ARRANGEMENT

[75] Inventor: Stephen W. Watkinson, Cambridge, England

[73] Assignee: U.S. Philips Corporation, New York, N.Y.

[21] Appl. No.: 276,093

[22] Filed: Jun. 22, 1981

[30] Foreign Application Priority Data

Jul. 2, 1980 [GB] United Kingdom ................ 8021658

[51] Int. Cl.³ .......................... H04B 1/16; H03L 7/06
[52] U.S. Cl. ................................. 455/260; 455/265; 331/2; 331/12
[58] Field of Search ............... 455/182, 183, 192, 260, 455/265; 331/2, 10–12, 18, 25

[56] References Cited

U.S. PATENT DOCUMENTS 3,336,534  8/1967  Gluth ................................... 331/12
4,322,751  3/1982  Hongu et al. ....................... 455/260

Primary Examiner—Jin F. Ng
Attorney, Agent, or Firm—Jack Oisher; William J. Streeter; Edward W. Goodman

[57] ABSTRACT

The double phase lock loop arrangement of the invention comprises a first feedback loop including a first voltage controlled oscillator (16), a second feedback loop including a second voltage controlled oscillator (20) and first (PSD1), second (PSD2) and third (PSD3) phase sensitive detectors. Each of the detectors have first and second inputs and an output, each first input being coupled to receive a signal which is derived from the first voltage controlled oscillator (16). The second voltage controlled oscillator (20) is connected to the second inputs of the first and second phase sensitive detectors (PSD1, PSD2) and via a phase shifter (21) to the second input of the third phase sensitive detector (PSD3) on whose output a lock signal is produced in response to the signals on its first and second inputs being in a desired phase relationship. The output of the second phase sensitive detector (PSD2) is an A.C. correction signal which is applied via a high pass filter (32) to the input of the second voltage controlled oscillator (20). The output of the first phase sensitive detector (PSD1) is a D.C. correction signal which, prior to the lock signal being produced, is applied to the second voltage controlled oscillator (20) to adjust the output frequency thereof and which, after the production of the lock signal, is applied to the first voltage controlled oscillator to adjust the output frequency thereof.

9 Claims, 3 Drawing Figures

DOUBLE PHASE LOCK LOOP ARRANGEMENT

BACKGROUND OF THE INVENTION

The present invention relates to a double phase lock loop arrangement which has particular, but not inclusive, application in portable radio receiving apparatus or in a portable transceiver.

When designing portable radio receivers, particularly narrow band multi-channel receivers, it is useful to employ automatic frequency conrol (AFC). This gives the advantage of maintaining the intermediate frequency (IF) signal in the center of the IF filter passband when the local oscillator frequency drifts due to temperature changes or component aging. Also the distortion produced in the receiver is minimized and matching of the cystal filter becomes less critical.

However, in multi-channel receivers, the automatic frequency control circuit may be affected by strong signals in channels adjacent to the selected channel. This particular applies in a receiver which works on the principle of a dual phase lock loop. Such a receiver is described in a paper read by Stephen W. Watkinson at the Communications 74 conference held in Brighton, England, during July 1974 and published in the Conference Proceedings at pages 13.1/1 to 13.1/8, the contents of which are hereby incorporated by reference. In this system a very high level adjacent channel signal will produce a beat frequency with the intermediate frequency voltage controlled crystal oscillator (IFVCXO). This waveform will frequency modulate the IFVCXO producing a non-sinusoidal error waveform containing a D.C. component. The D.C. component will be fed to the local oscillator causing its frequency to be pulled towards the frequency of the adjacent channel signal thus reducing the rejection of the adjacent channel signal. If the level of the adjacent signal is now reduced, the pulling effect may be maintained typically down to a level of 30 dB below that at which it started.

This problem may be reduced by including a low-pass filter in the feed-back path to the IFVCXO, but if the filter has rapid rolloff, the loop may become unstable. In practice, the loop filter must be limited to a single pole network and, consequently for a 12.5 KHz channel spacing, the attenuation of the 12.5 KHz best frequency is not sufficient to overcome the problem. An alternative arrangement would be to include a notch filter such as a Twin-Tee circuit, with the notch frequency at the difference between the selected channel and adjacent channel frequencies. However, if the notch is too deep, loop instability will again to produced because of reactive components in the notch filter circuit.

SUMMARY OF THE INVENTION

It is an object of the invention to provide a phase lock loop arrangement in which the tendency to pull towards an adjacent channel is reduced without the use of filters which include reactive components.

According to the present invention there is provided a double phase lock loop arrangement comprising a first feedback loop including a first voltage controlled oscillator, a second feedback loop including a second voltage controlled oscillator and first, second and third phase sensitive detectors, each detector having first and second inputs and an output, each first input being coupled to recieve a signal which is derived from the first voltage controlled oscillator, the second voltage controlled oscillator being connected to the second inputs of the first and second phase sensitive detectors and via phase shifting means to the second input of the third phase sensitive detector on whose output a lock signal is produced in response to the signals on its first and second inputs being in a desired phase relationship, the output of the first phase sensitive detector comprising a correction signal which, prior to a lock signal being produced, is applied to the second voltage controlled oscillator to adjust the output frequency thereof and which after the production of a lock signal is applied to the first voltage controlled oscillator to adjust the output frequency thereof.

The present invention further provides a radio receiving apparatus including an R.F. amplifier, a mixer having inputs coupled to an output of the R.F. amplifier and a voltage-controlled local oscillator which is included in a first feedback loop, an IF filter coupled to an output of the mixer, a second feedback loop including an IF voltage controlled oscillator for providing a reference signal and first, second and third phase sensitive detectors, each detector having first and second inputs and an output, each first input being coupled to an output of the IF filter, the IF voltage controlled oscillator being connected to the second inputs of the first and second phase sensitive detectors and via phase shifting means to the second input of the third phase sensitive detector on whose output a lock signal is produced in response to the signals on its first and second inputs being in a desired phase relationship, the output of the first phase sensitive detector comprising a correction signal which prior to a lock signal being produced is applied to the IF voltage controlled oscillator to adjust the output frequency thereof and which after the production of a lock signal is applied to the voltage controlled local oscillator to adjust the frequency thereof.

DESCRIPTION OF THE DRAWINGS

The present invention will now be described, by way of example, with reference to the accompanying drawings, wherein.

DESCRIPTION OF THE PREFERRED EMBODIMENT

Figure 1:
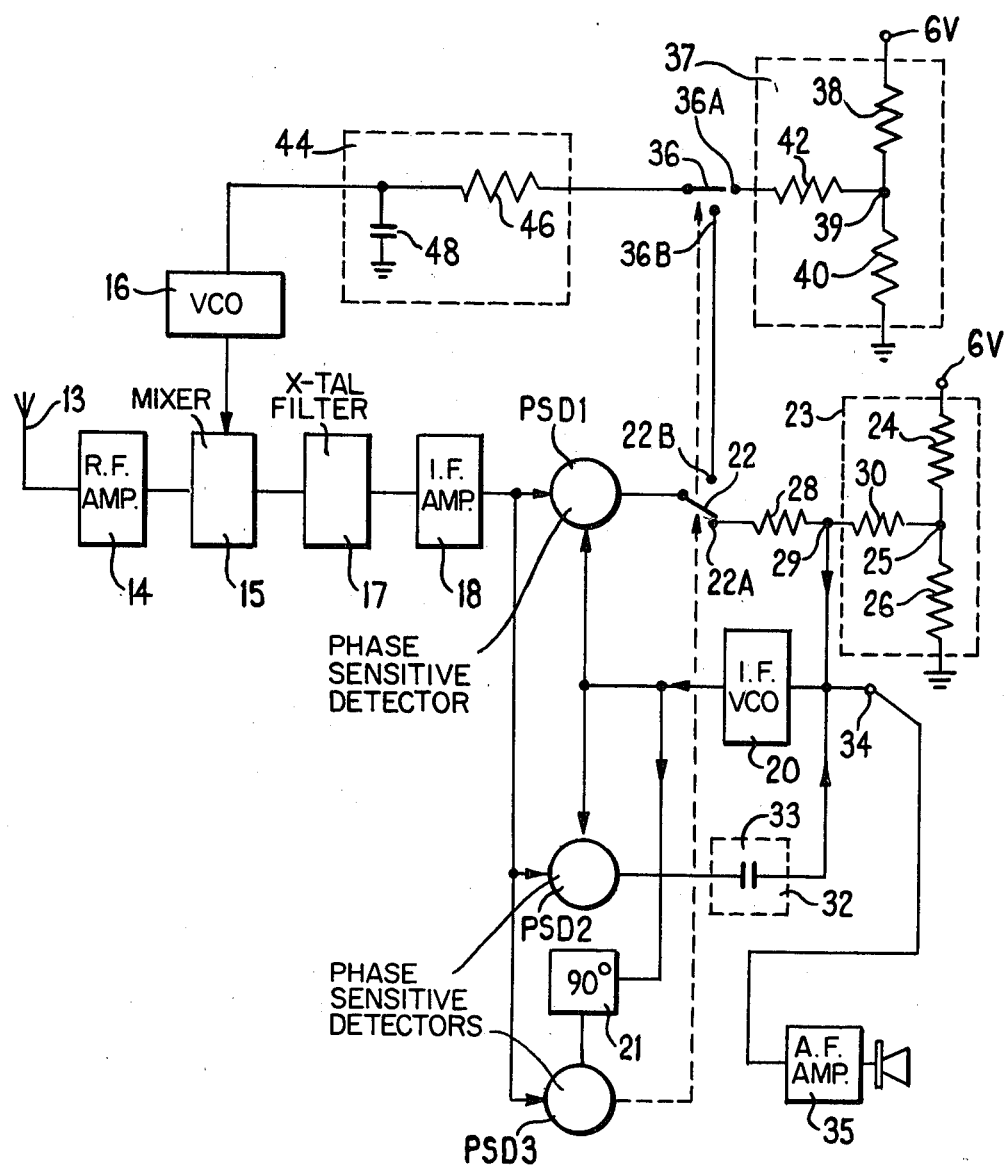
FIG. 1 is a block schematic circuit diagram of a radio receiving apparatus including a double phase lock loop arrangement in accordance with the present invention, and FIGS. 2 and 3 together are a schematic circuit diagram of one embodiment of the double phase lock loop arrangement in accordance with the present invention.

The radio receiving apparatus illustrated in FIG. 1 comprises an RF amplifier 14 coupled to receive a signal from an antenna 13 and to supply it to a mixer 15 which also receives an output from a local oscillator 16 which comprises a voltage controlled crystal oscillator. The products of the mixer 15 are supplied to a crystal filter 17 and the selected IF frequencies are supplied to an IF amplifier 18. The output of the IF amplifier 18 is supplied to first inputs of three phase sensitive detectors PSD1, PSD2 and PSD3. The output of an IF voltage controlled crystal oscillator (IFVCXO) 20 is supplied to second inputs of the phase sensitive detectors PSD1 and PSD2 and to a 90° phase shifting network 21. An output of the network 21 is supplied to a second input of the phase sensitive detector PSD3.

The output of the phase sensitive detector PSD1 is connected to a change-over switch 22 having fixed contacts 22A and 22B. The contact 22A is connected to an input of the IFVCXO 20 via a resistor 28. A resistive biasing network 23, comprising resistors 24 and 26 of equal value, is connected in series between a 6 V voltage source and ground, and a resistor 30 connected to a junction 25 of the resistors 24, 26 is connected to a junction 29 in the signal path from the resistor 28 to the IFVCXO 20. The resistance value of the resistor 30 is substantially twice as high as that of the resistor 28.

The output of the phase sensitive detector PSD2 is connected by way of a high-pass filter 32, represented in the drawing by a capacitor 33, to the input of the IFVCXO 20. An audio signal output 34 can be derived from the signals at the input of the IFVCXO 20.

An output from the phase sensitive detector PSD3, which functions as a lock detector, is used to operate the change-over switch 22 and another change-over switch 36. The contact 22B is connected to one of the contacts 36B of the switch 36, the other contact 36A of which is connected to a resistive biasing network 37, comprising resistors 38 and 40 of equal value, connected in series between a 6 V power supply and ground. A junction 39 of the resistors 38, 40 is connected by a high value resistor 42 to the contact 36A. The movable contact of the switch 36 is connected by way of a low-pass filter 44, formed by a series resistor 46 and a shunt capacitor 48, to an input of the local oscillator 16. The low-pass filter 44 removes any modulation component and high frequency noise components from the D.C. voltage used for controlling the frequency of the local oscillator 16.

If desired the switch 36 may be omitted so that the contact 22B and the resistor 42 are permanently coupled to the input of the low-pass filter 44. The low output impedance of PSD1, relative to the value of the resistor 42, enables the output voltage from PSD1 to determine the voltage applied to the filter 44 when the switch 22 is switched to the contact 22B.

The receiver has two control or feedback loops, one from the output of the phase sensitive detector PSD1, the switch contact 22A, IFVCXO 20 and back to PSD1 and the other from the phase sensitive detector PSD1, the switch contact 22B, the low-pass filter 44, the local oscillator 16 and to the mixer 15. The biasing networks 23 and 37 apply fixed biases to the respective loops so that IFVCXO 20 and the local oscillator 16 produce predetermined reference frequencies when not under dynamic control.

In order to avoid the problem of the local oscillator of the radio receiver working on 12½ KHz channel spacing, tending to be pulled over towards an unwanted adjacent channel high level signal, thus spoiling the adjacent channel selectivity, the illustrated receiving apparatus is arranged to act as a single control loop receiver until it is locked and only then can the automatic frequency control (AFC) action be established.

At start-up, the change-over switch 22 is connected to contact 22A and consequently the frequency of the local oscillator 16 is fixed by voltage at the junction 39 of the bias network 37. Hence there is no risk of the frequency of the local oscillator 16 being pulled over to that of an adjacent channel by an incorrect AFC voltage. The signal derived from the IF amplifier 18 is supplied simultaneously to the three phase sensitive detectors PSD1, PSD2, PSD3. The phase sensitive detector PSD1 applies a D.C. correction component to the IFVCXO 20 while the phase sensitive detector PSD2 simultaneously applies an A.C. correction component. Although PSD1 will also produce an A.C. correction component, its effect is rendered insignificant by making the gain of PSD2 greater than that of PSD1. If the signal at the output of the IF amplifier 18 is within the lock range of the IFVCXO 20 then the loop will lock the IFVCXO 20 on to that IF signal. Once the IFVCXO 20 has locked then PSD3 will produce an output which is used to actuate the switches 22 and 36 which change-over to contacts 22B and 36B, respectively. In so doing the D.C. and A.C. correction components from the phase sensitive detector PSD1 are applied as an AFC voltage to the local oscillator 16 via the low-pass filter 44. In the meantime IFVCXO 20 continues to receive the A.C. correction component from PSD2 together with a decaying D.C. correction voltage provided by the charge carried by the capacitor 33 which prevents an instantaneous change in the D.C. voltage applied to the IFVCXO 20 following the operation of the switch 22. However as the charge on the capacitor 33 decays, the frequency of the IFVCXO will change. Simultaneously though, the charge on the capacitor 48 will be changing from that defined by the resistors 38, 40 to that defined by the D.C. correction voltage from PSD1. If the switch 36 is omitted then by making the output impedance of PSD1 low compared to the value of the resistor 42, its output voltage will override that produced by the resistors 38, 40. The frequency of the local oscillator 16 follows changes in the voltage across the capacitor 48.

This process stops when the IFVCXO 20 returns to its unlocked rest frequency, the frequency of the local oscillator 16 having been changed by exactly the right amount to bring the IF frequency equal to the average unlocked IFVCXO 20 frequency which will have been preset by the bias network 23 to correspond to the center of the IF crystal filter 17 bandwidth.

The A.C. correction component from the PSD2 is applied to the IFVCXO 20 which can track the audio modulation on the received signal at the antenna 13. This modulation can be derived as an audio output signal from the output 34 and supplied to an A.F. amplifier 35 with its associated output transducer.

In the illustrated embodiment of the receiver the voltage controlled crystal oscillator of the local oscillator 16 is able to swing ±5 KHz for a swing of ±3 V on its input, the resistors 24, 26 have a value of 82 KΩ, the resistor 28 is of 560 KΩ and the resistors 30 and 42 are of 1 MΩ.

Figure 2:
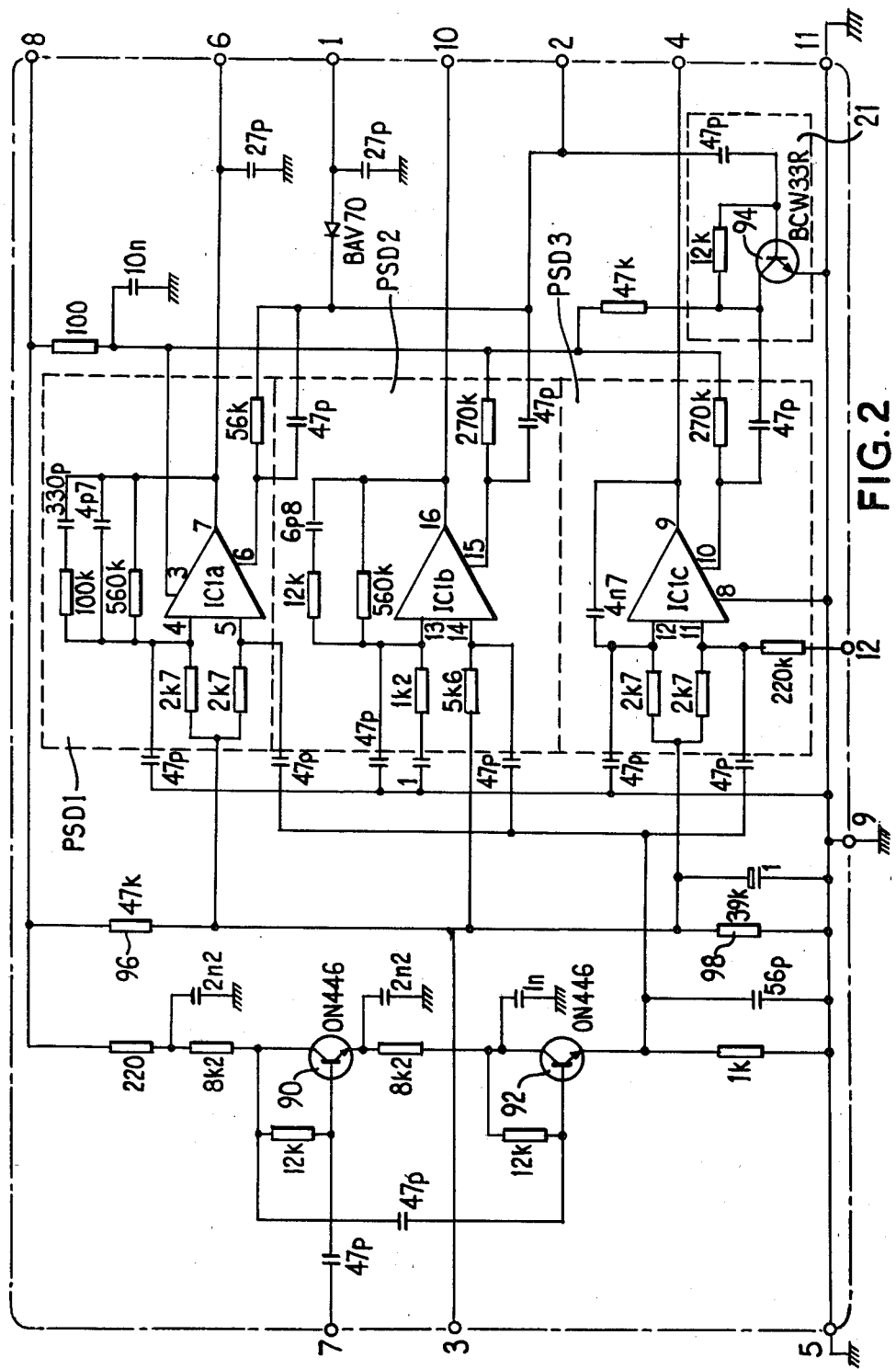
Figure 3:
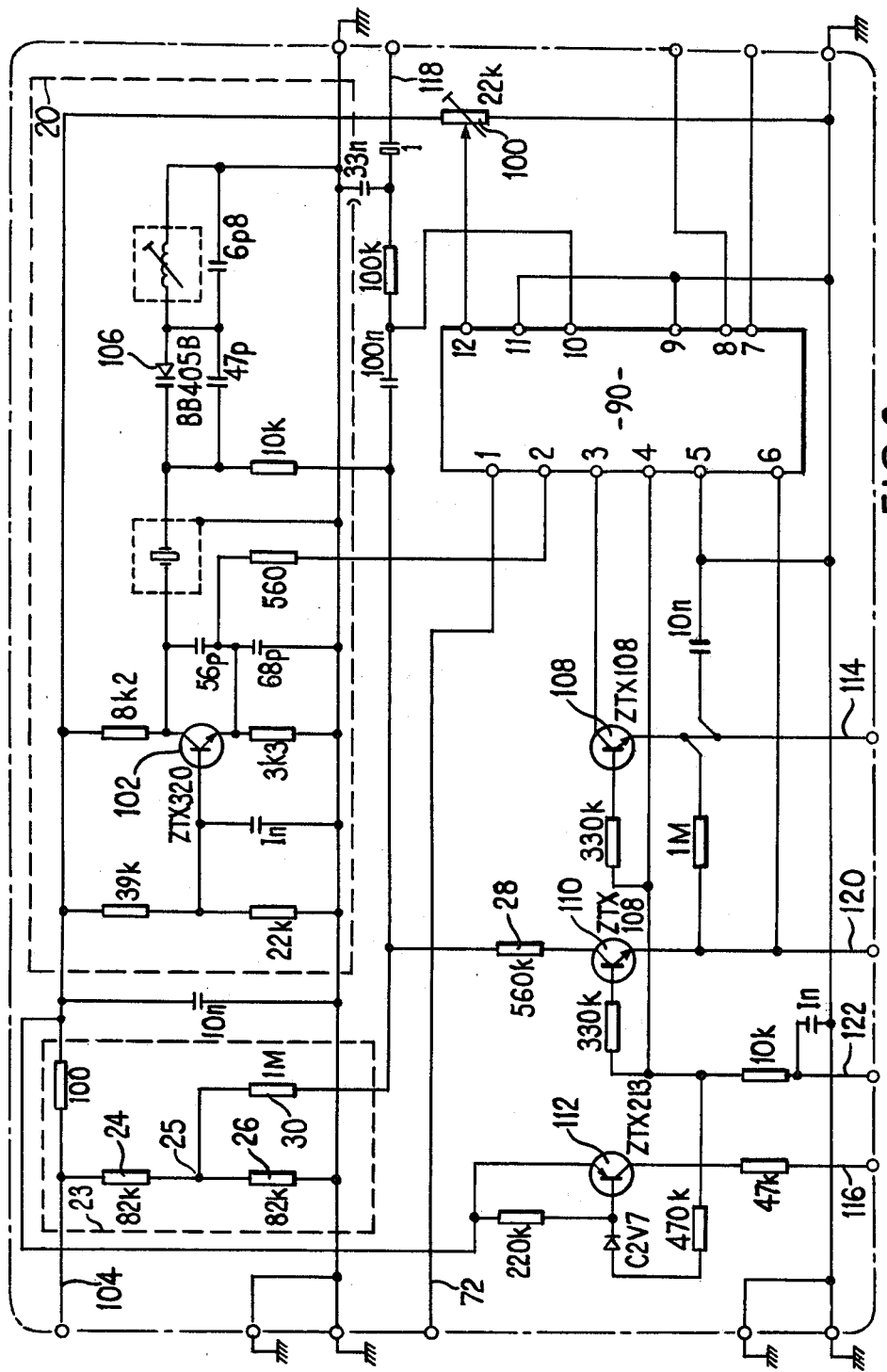

FIGS. 2 and 3 are a schematic circuit diagram of an embodiment of a double phase lock loop arrangement in accordance with the present invention. FIG. 2 comprises the rectangle 90 shown in FIG. 3 and the numbers shown within the rectangle correspond to the various terminals shown in FIG. 2.

Referring initially to FIG. 2, the three phase sensitive detectors PSD1, PSD2 and PSD3 are built around operational transconductance amplifiers IC1a, IC1b and IC1c which are incorporated into a single package under a type number CA 3060H manufactured and sold by Radio Corporation of America. The numbers associated with each amplifier correspond to the pin numbers of the integrated circuit package. The amplifier IC1a includes a high pass filter in its feedback path and the amplifier IC1a has a single capacitor in its feedback path.

Beginning at the terminal 7 the input signal, which is the IF signal from the IF amplifier 18 (FIG. 1), is applied to an inverting amplifier, transistor 90, whose output is applied via an emitter follower transistor 92 and coupling capacitors to an input of each of the amplifiers IC1a, IC1b and IC1c. The reference signal applied to each of the amplifiers IC1a and IC1b and the phase shifting network 21 is the IFVCXO 20 (FIG. 1) output on terminal 2. The phase shifting network 21 is based on a transistor 94. A lock signal, when present on the amplifier IC1c output, appears on terminal 4, a D.C. correction voltage from the amplifier IC1a appears on the terminal 6 and an audio modulation signal derived from the amplifier IC1b appears on the terminal 10. A supply voltage of 7.1 Volts is applied to the terminal 8. This voltage is stepped-down by a potential divider comprising resistors 96 and 98 and applied as a bias voltage to the inputs of the amplifiers IC1a, IC1b and IC1c and to the terminal 3. As shown the terminals 5, 9 and 11 are connected to ground. Finally the terminal 12, which is also connected to the inputs of the amplifiers IC1a, IC1b and IC1c, is used to apply an additional bias voltage to these inputs when the receiver is operative, this additional bias voltage being derived from the tapping of a potentiometer 100 (FIG. 3).

Referring now to FIG. 3, assuming that the receiving apparatus is energized, then the IFVCXO 20, based on transistor 102, is energized via line 104 and supplies its output signal to the terminal 2 of the rectangle 90. Since PSD3 has not locked, the output on the terminal 4 is used to bias the transistors 108, 110 and 112 on. The correction voltage on terminal 6 is applied via the transistor 110 to a varactor diode 106 of the IFVCXO 20 where it is used to adjust the frequency of the IFVCXO 20. In the case of the transistor 108, when it is conductive a fixed bias from terminal 3 is applied to the line 114. The transistor 112 when conductive applies a squelch signal via a line 116 to the receiver A.F. amplifier 35 (FIG. 1) to suppress any audio outputs.

When PSD3 produces a lock signal, then the transistors 108, 110 and 112 are rendered non-conductive so that the D.C. correction voltage on the terminal 6 is applied to the line 114 where it is used as an AFC voltage for the voltage controlled crystal oscillator of the local oscillator 16 (FIG. 1). The varactor diode 106 receives a fixed bias from the resistive biasing network 23 so that the frequency of the IFVCXO 20 becomes substantially constant. Finally the squelch signal is inhibited and the A.F. amplifier 35 can produce an audio output.

In the case of the receiving apparatus being incorporated in a transceiver, when a transmitting section (not shown) is energized the receiving apparatus is de-energized and the supply voltage on the line 104 is removed thereby rendering the IFVCXO 20 and the squelch circuit, transistor 112, inoperative. The phase sensitive detector PSD1 is still used to compare signals in the transmitting section (not shown) so that the D.C. correction signal on the terminal 6 is applied to a transmitter control loop (not shown) via the line 120.

The component types and values are as shown in the schematic circuits of FIGS. 2 and 3. The operation of the circuits will be evident from the description of FIG. 1.

I claim:

1. A double phase lock loop arrangement comprising a first feedback loop including a first voltage controlled oscillator and a first phase sensitive detector, a second feedback loop including a second voltage controlled oscillator, said first phase sensitive detector and second and third phase sensitive detectors, each detector having first and second inputs and an output, each first input being coupled to receive a signal which is derived from the first voltage controlled oscillator, the second voltage controlled oscillator being connected to the second inputs of the first and second phase sensitive detectors and via phase shifting means to the second input of the third phase sensitive detector on whose output a lock signal is produced in response to the signals on its first and second inputs being in a desired phase relationship, the output of said second phase sensitive detector being coupled to said second voltage controlled oscillator, the output of the first phase sensitive detector comprising a correction signal, and switching means for coupling, in response to the absence of the lock signal, the output of said first phase sensitive detector to the second voltage controlled oscillator for adjusting the output frequency thereof and for coupling, in response to the presence of the lock signal, the output of said first phase sensitive detector to the first voltage controlled oscillator for adjusting the output frequency thereof.

2. An arrangement as claimed in claim 1, further comprising means for applying a fixed bias voltage to that one of the first and second voltage controlled oscillators which is not being controlled by the correction signal.

3. An arrangement as claimed in claim 1 or 2, further comprising a high-pass filter coupling the output of the second phase sensitive detector to the second voltage controlled oscillator.

4. A radio receiving apparatus including an RF amplifier, a mixer having inputs coupled to an output of the RF amplifier and a voltage controlled local oscillator and a first phase sensitive detector which are included in a first feedback loop, an IF filter coupled to an output of the mixer, a second feedback loop including an IF voltage controlled oscillator for providing a reference signal, said first phase sensitive detector and second and third phase sensitive detectors, each detector having first and second inputs and an output, each first input being coupled to an output of the IF filter, the IF voltage controlled oscillator being connected to the second inputs of the first and second phase sensitive detectors and via phase shifting means to the second input of the third phase sensitive detector on whose output a lock signal is produced in response to the signals on its first and second inputs being in a desired phase relationship, the output of said second phase sensitive detector being coupled to said IF voltage controlled oscillator, the output of the first phase sensitive detector comprising a correction signal, and switching means coupling, in response to absence of the lock signal, the output of said first phase sensitive detector to the IF voltage controlled oscillator for adjusting the output frequency thereof and for coupling, in response to the presence of the lock signal, the output of said first phase sensitive detector to the voltage controlled local oscillator for adjusting the frequency thereof.

5. An apparatus as claimed in claim 4 further comprising means for applying a fixed bias voltage to that one of the voltage controlled local oscillator and the IF voltage controlled oscillator which is not being controlled by the correction signal.

6. An apparatus as claimed in claim 4, further comprising fixed voltage biasing means coupled to the voltage controlled local oscillator, wherein the first phase detector has a low output impedance so that the correction signal overrides the voltage produced by the fixed voltage biasing means.

7. An apparatus as claimed in claim 4, further comprising a fixed voltage biasing means and further switching means having a first input connected to the fixed voltage biasing means, a second input connected to receive the output of the first phase sensitive detector by way of the first-mentioned switching means, and an output coupled to the voltage controlled local oscillator, the further switching means being responsive to the lock signal to change-over from the first to the second input thereof.

8. An apparatus as claimed in claim 4, 6 or 7, further comprising fixed voltage biasing means connected to the IF voltage controlled oscillator.

9. An apparatus as claimed in claim 4, further comprising a high-pass filter coupling the output of the second phase sensitive detector to the IF voltage controlled oscillator.

* * * * *